United States Patent
Nakajima

(10) Patent No.: US 8,680,505 B2
(45) Date of Patent: Mar. 25, 2014

(54) SEMICONDUCTOR MEMORY DEVICE

(71) Applicant: Kabushiki Kaisha Toshiba, Minato-ku (JP)

(72) Inventor: Hiroomi Nakajima, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/961,575

(22) Filed: Aug. 7, 2013

(65) Prior Publication Data

US 2013/0320292 A1    Dec. 5, 2013

Related U.S. Application Data

(62) Division of application No. 13/043,662, filed on Mar. 9, 2011, now Pat. No. 8,530,879.

(30) Foreign Application Priority Data

Jul. 21, 2010    (JP) ................................ 2010-164274

(51) Int. Cl.
    *H01L 29/06*    (2006.01)
(52) U.S. Cl.
    USPC ..... 257/5; 257/2; 257/3; 257/4; 257/E45.001; 257/E45.002; 257/E45.003
(58) Field of Classification Search
    USPC .................. 257/2, 3, 4, 5, E45.001, E45.002, 257/E45.003
    See application file for complete search history.

(56) References Cited

U.S. PATENT DOCUMENTS

| | | | |
|---|---|---|---|
| 6,034,882 | A | 3/2000 | Johnson et al. |
| 2010/0034012 | A1 | 2/2010 | Matsuo |
| 2010/0213550 | A1 | 8/2010 | Kanno et al. |
| 2010/0238704 | A1 | 9/2010 | Komura et al. |
| 2011/0068315 | A1 | 3/2011 | Nakajima |

FOREIGN PATENT DOCUMENTS

WO    2005-522045    7/2005

*Primary Examiner* — Andy Huynh
(74) *Attorney, Agent, or Firm* — Oblon, Spivak, McClelland, Maier & Neustadt, L.L.P.

(57) ABSTRACT

A semiconductor memory device, including: plural parallel first lines; plural second lines disposed to intersect the first lines; and a memory cell array including memory cells, disposed at intersections of the first lines and the second lines, each of the memory cells configured by a rectifier element and a variable resistor connected in series. The rectifier element includes: a first semiconductor region including an impurity of a first conductivity type at a first impurity concentration; and a second semiconductor region including an impurity of a second conductivity type at a second impurity concentration lower than the first impurity concentration and including an impurity of the first conductivity type at a third impurity concentration lower than the second impurity concentration, the first and second semiconductor regions being formed by silicon.

11 Claims, 9 Drawing Sheets

SEMICONDUCTOR MEMORY DEVICE

CROSS REFERENCE TO RELATED APPLICATION

This application is a divisional of U.S. application Ser. No. 13/043,662 filed Mar. 9, 2011, and is based upon and claims the benefit of priority from prior Japanese Patent Application No. 2010-164274, filed on Jul. 21, 2010, the entire contents of each of which are incorporated herein by reference.

BACKGROUND

1. Field

Embodiments described in this specification relate to a semiconductor memory device comprising an arrangement of memory cells, the memory cells configured to store data by change in a resistance value of a variable resistor.

2. Description of the Related Art

In recent years, along with a rising level of integration in semiconductor devices, circuit patterns of transistors and so on configuring these semiconductor devices are being increasingly miniaturized. Required in this miniaturization of the patterns is not simply a thinning of line width but also an improvement in dimensional accuracy and positioning accuracy of the patterns. This trend applies also to semiconductor memory devices.

Conventionally known and marketed semiconductor memory devices such as DRAM, SRAM, and flash memory each use a MOSFET as a memory cell. Consequently, there is required, accompanying the miniaturization of patterns, an improvement in dimensional accuracy at a rate exceeding a rate of the miniaturization. As a result, a large burden is placed also on the lithography technology for forming these patterns which is a factor contributing to a rise in product cost.

In recent years, resistance varying memory is attracting attention as a candidate to succeed these kinds of semiconductor memory devices employing a MOSFET as a memory cell. The resistance varying memory herein includes not only resistance varying memory (ReRAM: Resistive RAM) in its narrow definition, which uses a transition metal oxide as a recording layer to store a resistance state of the transition metal oxide in a non-volatile manner, but also phase change memory (PCRAM: Phase Change RAM), which uses chalcogenide or the like as a recording layer to utilize resistance information of a crystalline state (conductor) and an amorphous state (insulator).

Write of data to a memory cell is performed by applying a certain voltage to a variable resistor for a short time. This causes the variable resistor to change from a high-resistance state to a low-resistance state. This operation to change the variable resistor from the high-resistance state to the low-resistance state is hereafter referred to as a setting operation.

On the other hand, erase of data in a memory cell is performed by applying a certain voltage to a variable resistor for a long time, the certain voltage being lower than the voltage applied during the setting operation, and the variable resistor being one in the low-resistance state subsequent to the setting operation. This causes the variable resistor to change from the low-resistance state to the high-resistance state. This operation to change the variable resistor from the low-resistance state to the high-resistance state is hereafter referred to as a resetting operation. The memory cell adopts, for example, the high-resistance state as a stable state (reset state), and, in the case of binary data storage, write of data is performed by the setting operation in which the reset state is changed to the low-resistance state.

During the resetting operation, a large current, which acts as a resetting current, must be passed through the memory cell. As a result, a diode connected in series to the variable resistor is required to have an output current which is large. However, if a simple PN junction diode is used for the diode, an unselected memory cell cannot be applied with a voltage greater than a voltage determined by the junction breakdown voltage of the PN junction diode, whereby the output current of the PN junction diode is limited.

DETAILED DESCRIPTION

A semiconductor memory device in accordance with an embodiment comprises a plurality of first lines disposed in parallel, a plurality of second lines disposed to intersect the first lines, and a memory cell array including memory cells. Each of the memory cells is disposed at each of intersections of the first lines and the second lines, and each of the memory cells is configured by a rectifier element and a variable resistor connected in series. The rectifier element comprises a first semiconductor region of a first conductivity type including an impurity of a first impurity concentration, and a second semiconductor region of a second conductivity type including an impurity of a second impurity concentration lower than the first impurity concentration. The first semiconductor region and the second semiconductor region are formed by silicon. A junction interface of the first semiconductor region and the second semiconductor region is a pseudo-heterojunction formed by two layers that have different band gap widths and are formed of the same material.

Next, embodiments of the present invention are described with reference to the drawings. Note that in the following descriptions of drawings in the embodiments, identical symbols are assigned to places having identical configurations, and descriptions thereof are omitted.

[Overall Configuration]

Figure 1:
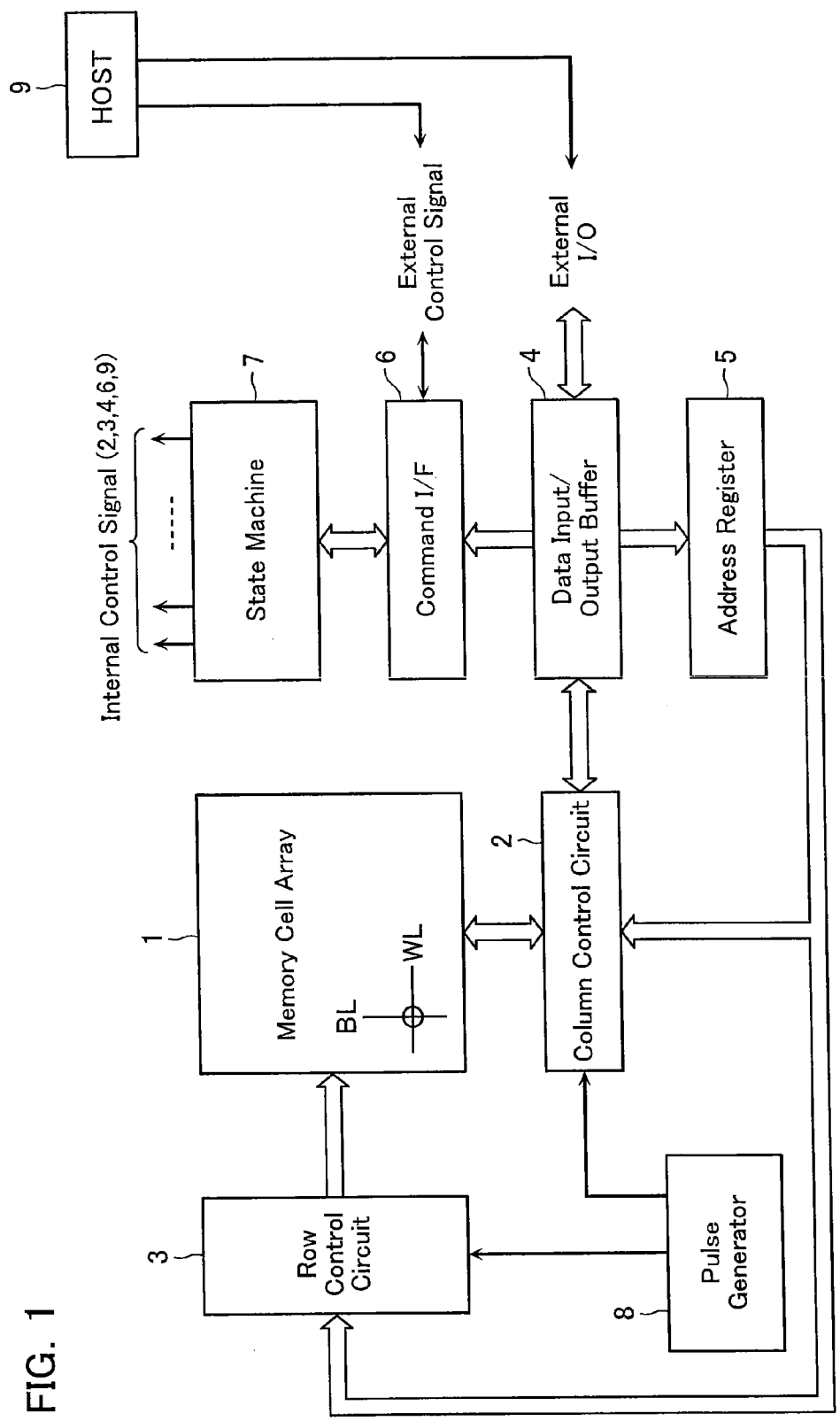
FIG. 1 is a block diagram of a semiconductor memory device in accordance with a first embodiment of the present invention.

FIG. 1 is a block diagram of a nonvolatile memory in accordance with a first embodiment of the present invention. The nonvolatile memory comprises a memory cell array 1 of memory cells arranged in a matrix, each memory cell including a later-described ReRAM (variable resistor).

A column control circuit 2 is provided at a position adjacent to the memory cell array 1 in a bit line BL direction. The column control circuit 2 controls the bit line BL in the memory cell array 1 to erase data in the memory cell, write data to the memory cell, and read data from the memory cell. A row control circuit 3 is provided at a position adjacent to the memory cell array 1 in a word line WL direction. The row control circuit 3 selects the word line WL in the memory cell array 1 and applies voltages required to erase data in the memory cell, write data to the memory cell, and read data from the memory cell.

A data input/output buffer 4 is connected to an external host 9 via an input/output (I/O) line to receive write data, receive erase instructions, output read data, and receive address data and command data. The data input/output buffer 4 sends received write data to the column control circuit 2 and receives read data from the column control circuit 2 and outputs it to external. An address supplied from external to the data input/output buffer 4 is sent via an address register 5 to the column control circuit 2 and the row control circuit 3.

A command supplied from the host 9 to the data input/output buffer 4 is sent to a command interface 6. The command interface 6 receives an external control signal from the host 9 and decides whether the data inputted to the data input/output buffer 4 is write data, a command or an address. If the data is a command, then the command interface 6 transfers it as a received command signal to a state machine 7.

The state machine 7 manages the entire nonvolatile memory to receive commands from the host 9 via the command interface 6, and perform read, write, erase, data input/output management, and so on. The external host 9 can also receive status information managed by the state machine 7 and decide the operation result. The status information is also utilized in control of write and erase. Further, the state machine 7 controls a pulse generator 8. Under this control, the pulse generator 8 is allowed to output a pulse of any voltage at any timing.

The pulse formed herein can be transferred to any line selected by the column control circuit 2 and the row control circuit 3. Note that peripheral circuit elements other than the memory cell array 1 can be formed in a silicon substrate immediately beneath the memory cell array 1 formed in a wiring layer. Thus, the chip area of the nonvolatile memory can be made almost equal to the area of the memory cell array 1.

[Memory Cell Array and Peripheral Circuits]

Figure 2:
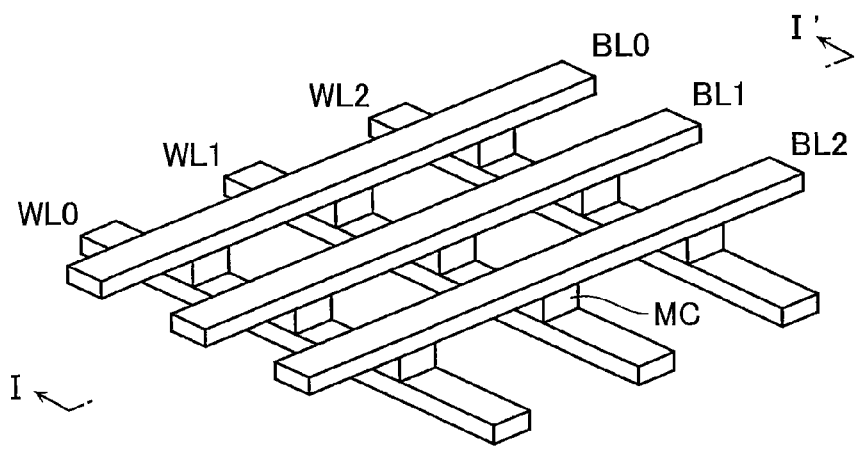
FIG. 2 is a perspective view of part of a memory cell array 1.
Figure 3:
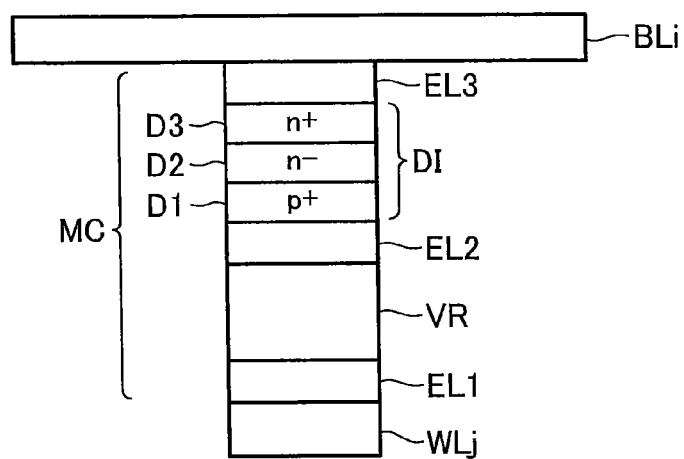
FIG. 3 is a cross-sectional view of one memory cell taken along the line I-I' and seen in the direction of the arrows in FIG. 2.

FIG. 2 is a perspective view of part of the memory cell array 1, and FIG. 3 is a cross-sectional view of one memory cell taken along the line I-I' and seen in the direction of the arrows in FIG. 2. There are plural word lines WL0-WL2 as first lines disposed in parallel, which intersect plural bit lines BL0-BL2 as second lines disposed in parallel. A memory cell MC is disposed at each of intersections of the word lines WL0-WL2 and bit lines BL0-BL2 to be sandwiched therebetween. Desirably, the first and second lines are composed of a heat-resistive low-resistance material such as W, WSi, NiSi, or CoSi.

[Memory Cell MC]

As shown in FIG. 3, the memory cell MC comprises a serial connection circuit of a variable resistor VR and a diode DI. Used for the variable resistor VR is a substance which can vary its resistance through current, heat, or chemical energy on voltage application. Disposed above and below the variable resistor VR and the diode DI are electrodes EL1, EL2, and EL3 configured to function as a barrier metal layer and an adhesive layer. Disposed above the electrode EL1 is the variable resistor VR, and disposed above the variable resistor VR is the electrode EL2. Disposed above the electrode EL2 is the diode DI, and disposed above the diode DI is the electrode EL3. Material of the electrodes EL1 and EL3 may include Pt, Au, Ag, TiAlN, SrRuO, Ru, RuN, Ir, Co, Ti, TiN, TaN, LaNiO, Al, PtIrO$_x$, PtRhO$_x$, Rh, TaAlN, W, or the like. Moreover, material of the electrode EL2 may include W, WN, TaN, TaSiN, TaSi$_2$, TiC, TaC, Nb—TiO$_2$, or the like. Material of the electrode EL2 may similarly be adopted also for the electrodes EL1 and EL3. In addition, a metal film capable of achieving uniform orientation may also be interposed. Moreover, a separate buffer layer, barrier metal layer and adhesive layer may further be interposed.

[Diode DI]

As shown in FIG. 3, the diode DI is a PN junction diode comprising a p+ type layer D1 (first semiconductor region), an n− type layer D2 (second semiconductor region), and an n+ type layer D3. The "+" and "−" symbols used here indicate magnitude of impurity concentration. Configuration of the diode DI is described in detail later.

[Variable Resistor VR]

The variable resistor VR may include one that comprises a composite compound containing cations of a transition element and varies the resistance through migration of the cations (ReRAM).

Figure 4:
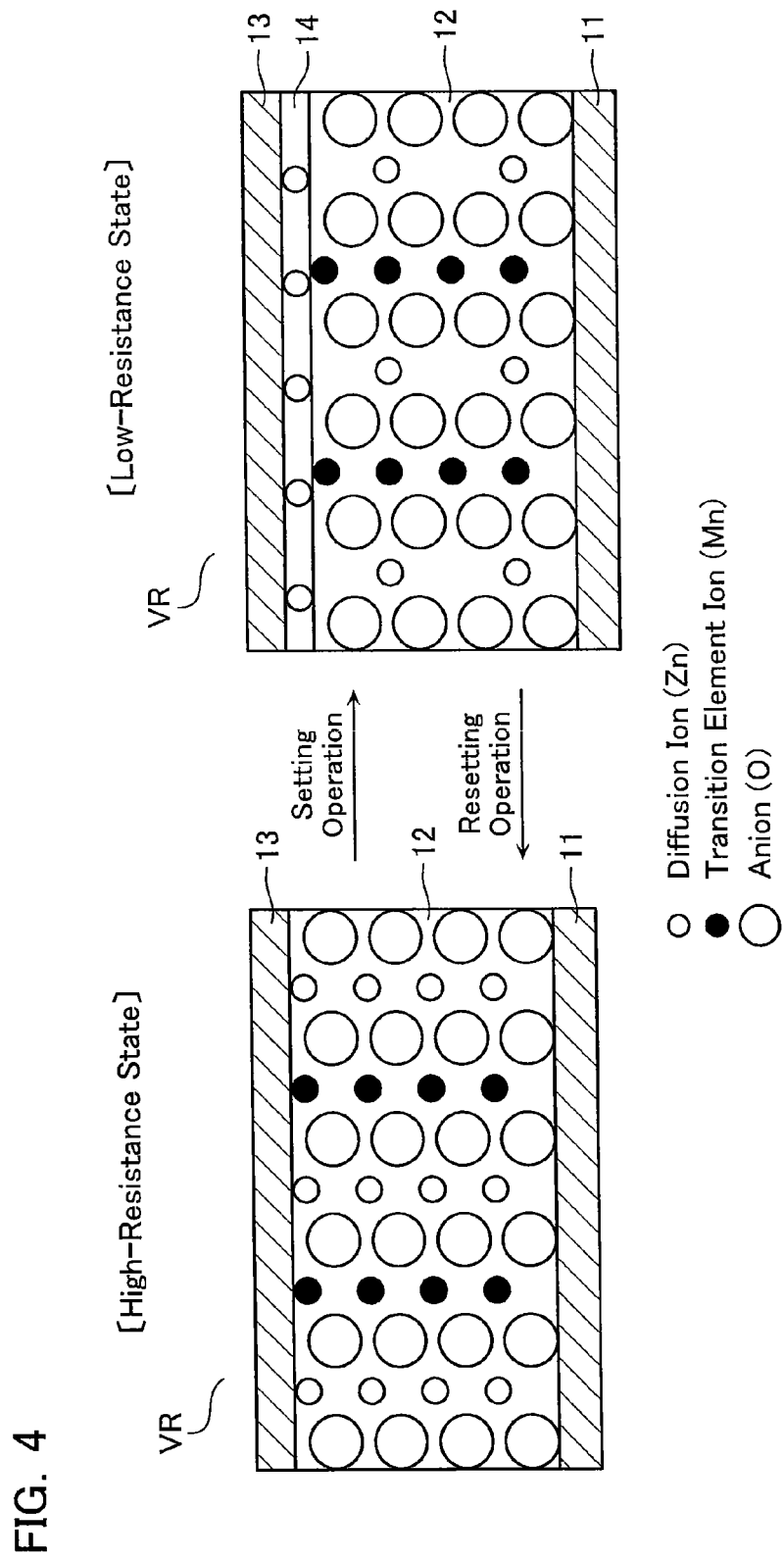
FIG. 4 is a view showing an example of a variable resistor VR.
Figure 5:
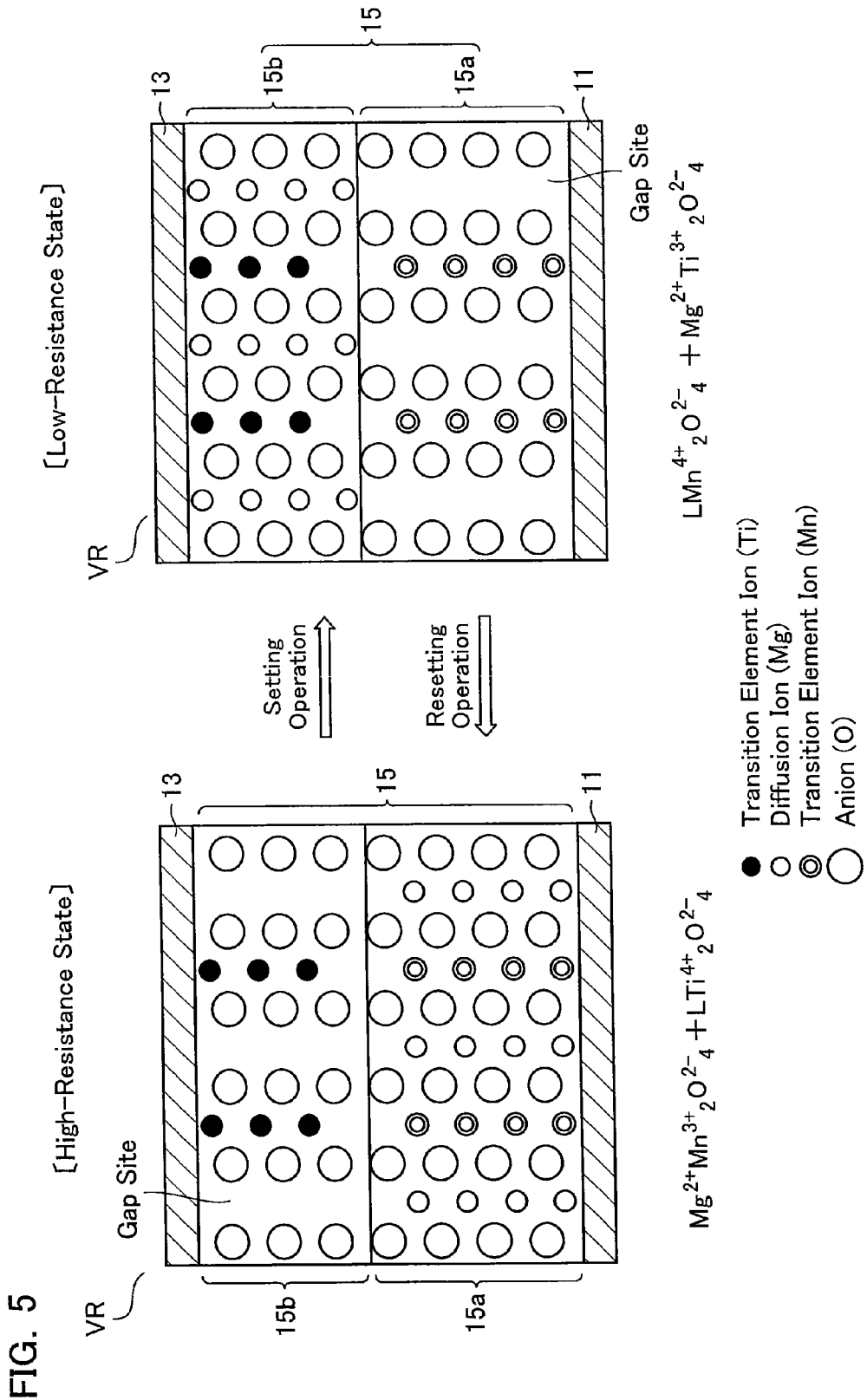
FIG. 5 is a view showing an example of a variable resistor VR.

FIGS. 4 and 5 show examples of the variable resistor VR. The variable resistor VR shown in FIG. 4 includes a recording layer 12 arranged between electrode layers 11, 13. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be configured by material having a crystalline structure such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

Two types of configurations of a variable resistor in resistance varying memory are known. One type, known as a bipolar type, sets a high-resistance state and a low-resistance state by switching the polarity of applied voltage. The other type, known as a unipolar type, sets the high-resistance state and the low-resistance state by controlling voltage value and voltage application time, without switching the polarity of applied voltage.

The unipolar type is preferable for realizing a high density memory cell array. This is because, in the case of the unipolar type, the cell array can be configured by stacking a variable resistor and a rectifier element such as a diode at intersections of bit lines and word lines, without using transistors. Furthermore, arranging this kind of memory cell array to be stacked three-dimensionally makes it possible to achieve a large capacity, without increasing cell array area.

That is, adopting the serial connection circuit of a variable resistor VR and a diode DI for the memory cell MC allows execution of a setting operation configured to apply a certain voltage to the variable resistor VR for a short time, and a resetting operation configured to apply a certain voltage, which is lower than the voltage applied during the setting operation, to the variable resistor VR for a long time. The present embodiment can be easily applied to the diode accompanying a unipolar type variable resistor.

In the example of FIG. 4, A comprises Zn, M comprises Mn, and X comprises O, $ZnMn_2O_4$ being used. Alternatively, the variable resistor VR may also be configured by a thin film comprising one material from among $NiO$, $TiO_2$, $SrZrO_3$, $Pr_{0.7}Ca_{0.3}MnO_3$, and the like.

In the recording layer 12 of FIG. 4, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes the setting operation. On reading, a current may be allowed to flow, of which value is very small so that the material configuring the recording layer causes no resistance variation. The programmed state (low-resistance state) may be reset to the erased state (high-resistance state) by supplying a large current flow in the recording layer 12 for a sufficient time, which causes Joule heating to facilitate the oxidation reduction reaction in the recording layer 12. Application of an electric field in the opposite direction from that at the time of setting may also allow the resetting operation to be performed.

In the example of FIG. 5, a recording layer 15 sandwiched between the electrode layers 11, 13 is formed of two layers: a first compound layer 15a and a second compound layer 15b. The first compound layer 15a is arranged on the side close to the electrode layer 11 and represented by a chemical formula $A_xMl_yXl_z$. The second compound layer 15b is arranged on the side close to the electrode layer 13 and has gap sites capable of accommodating cation elements from the first compound layer 15a.

In the example of FIG. 5, A comprises Mg, Ml comprises Mn, and Xl comprises 0 in the first compound layer 15a. The second compound layer 15b contains Ti shown with black circles as transition reduction ions. Moreover, in the first compound layer 15a, a small white circle represents a diffused ion (Mg), a large white circle represents an anion (O), and a double circle represents a transition element ion (Mn). Note that the first compound layer 15a and the second compound layer 15b may be stacked in multiple layers such as two or more layers.

In this variable resistor VR, potentials are given to the electrode layers 11, 13 so that the first compound layer 15a serves as an anode and the second compound layer 15b serves as a cathode to cause a potential gradient in the recording layer 15. In this case, part of diffused ions in the first compound layer 15a migrate through the crystal and enter the second compound layer 15b on the cathode side. The crystal of the second compound layer 15b includes gap sites capable of accommodating diffused ions. Accordingly, the diffused ions moved from the first compound layer 15a are trapped in the gap sites. Therefore, the valence of the transition element ion in the first compound layer 15a increases while the valence of the transition element ion in the second compound layer 15b decreases. In the initial state, the first and second compound layers 15a, 15b may be in the high-resistance state. In such a case, migration of part of diffused ions in the first compound layer 15a therefrom into the second compound layer 15b generates conduction carriers in the crystals of the first and second compounds, and thus both have electrical conduction.

Note that the programmed state (low-resistance state) may be reset to the erased state (high-resistance state) by supplying a large current flow in the recording layer 15 for a sufficient time for Joule heating to facilitate the oxidation reduction reaction in the recording layer 15, similarly to the preceding example. Application of an electric field in the opposite direction from that at the time of setting may also allow resetting.

[Modified Example of Memory Cell Array]

Figure 6:
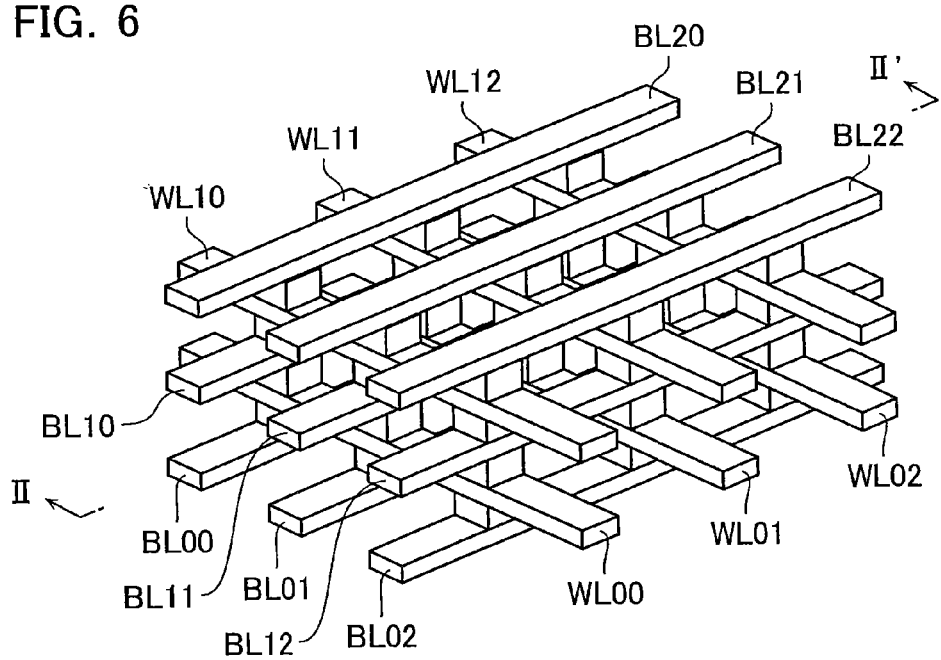
FIG. 6 is a view showing a separate configuration example of the memory cell array 1.
Figure 7:
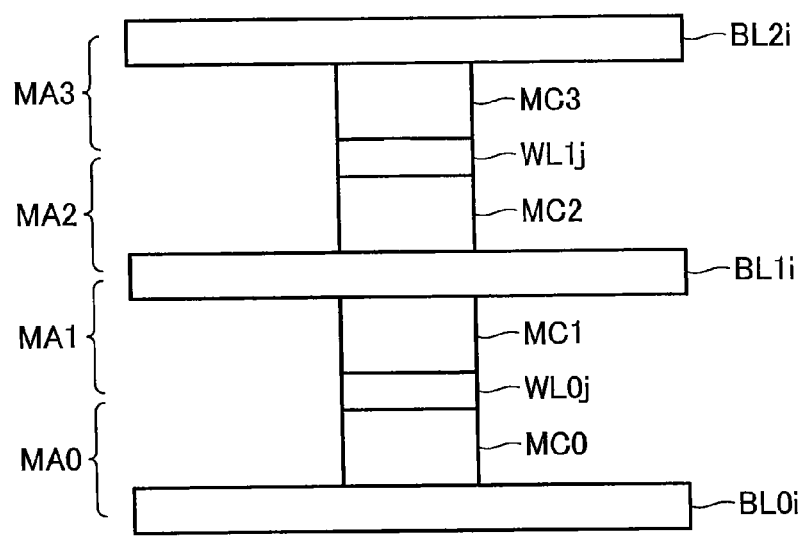
FIG. 7 is a view showing the separate configuration example of the memory cell array 1.

Moreover, as shown in FIG. 6, plural such memory structures described above may be stacked to form a three-dimensional structure. FIG. 7 is a cross-sectional view showing a II-II' section in FIG. 6. The shown example relates to a memory cell array of a 4-layer structure having cell array layers MA0-MA3.

A word line WL0j is shared by an upper and a lower memory cell MC0, MC1. A bit line BL1i is shared by an upper and a lower memory cell MC1, MC2. A word line WL1j is shared by an upper and a lower memory cell MC2, MC3.

In place of the line/cell/line/cell repetition, an interlayer insulating film may be interposed as a line/cell/line/interlayer-insulating-film/line/cell/line between cell array layers. Note that the memory cell array 1 may be divided into MATs of several memory cell groups. The column control circuit 2 and the row control circuit 3 described above may be provided on a MAT-basis, a sector-basis, or a cell array layer MA-basis or shared by them. Alternatively, they may be shared by plural bit lines BL to reduce the area.

Figure 8:
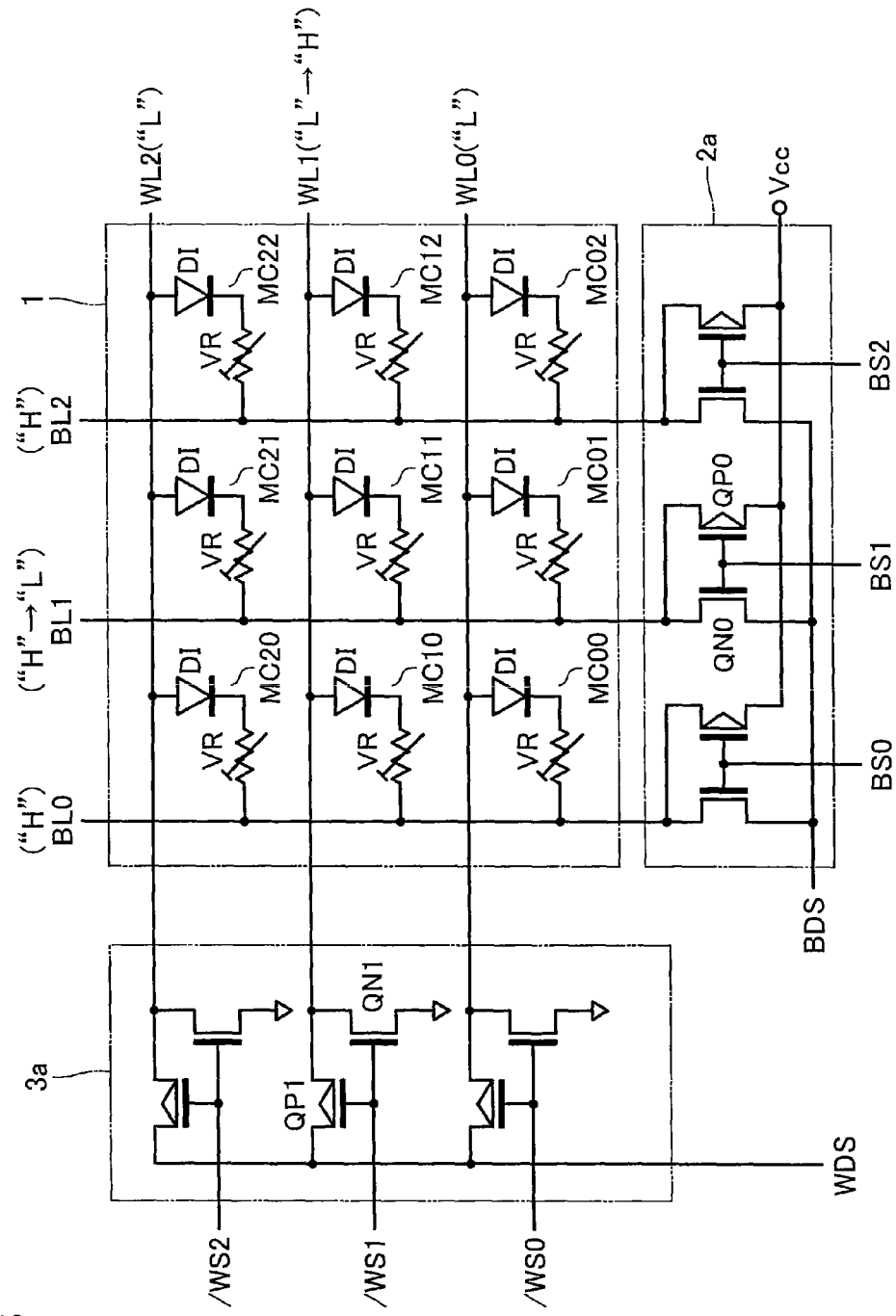
FIG. 8 is a circuit diagram of the memory cell array 1 and peripheral circuits thereof.

FIG. 8 is a circuit diagram of the memory cell array 1 and peripheral circuits thereof. For simplicity, the description advances on the assumption that the memory has a single-layered structure. In FIG. 8, the diode DI contained in the memory cell MC has its anode connected to the word line WL and its cathode connected to the bit line BL via the variable resistor VR. Each bit line BL has one end connected to a selection circuit 2a, which is part of the column control circuit 2. Each word line WL has one end connected to a selection circuit 3a, which is part of the row control circuit 3.

The selection circuit 2a includes a selection PMOS transistor QP0 and a selection NMOS transistor QN0, provided to each bit line BL, of which gates and drains are commonly connected. The selection PMOS transistor QP0 has its source connected to a high potential power supply Vcc. The selection NMOS transistor QN0 has its source connected to a bit-line side drive sense line BDS, which is used to apply a write pulse and supply a detection current during data read. The transistors QP0, QN0 have a common drain connected to the bit line BL, and a common gate supplied with a bit-line selection signal BSi for selecting each bit line BL.

The selection circuit 3a includes a selection PMOS transistor QP1 and a selection NMOS transistor QN1, provided to each word line WL, of which gates and drains are commonly connected. The selection PMOS transistor QP1 has its source connected to a word-line side drive sense line WDS, which is used to apply a write pulse and supply a detection current during data read. The selection NMOS transistor QN1 has its source connected to a low potential power supply Vss. The transistors QP1, QN1 have a common drain connected to the word line WL and a common gate supplied with a word-line selection signal /WSi for selecting each word line WL.

The example shown above is suitable for selecting the memory cells individually. In contrast, in batch read of data from plural memory cells MC connected to the word line WL1, sense amplifiers are arranged individually for the bit lines BL0-BL2, and the bit lines BL0-BL2 are connected to the sense amplifiers individually via the selection circuit $2a$ using the bit-line selection signals BS. In addition, the memory cell array 1 may be configured to include diodes DI having a polarity reversed from that of the circuit shown in FIG. 7 (connected having a direction from the bit line BL to the word line WL as a forward bias direction), such that current flows from the bit line BL side to the word line WL side.

[Diode DI]

Figure 9:
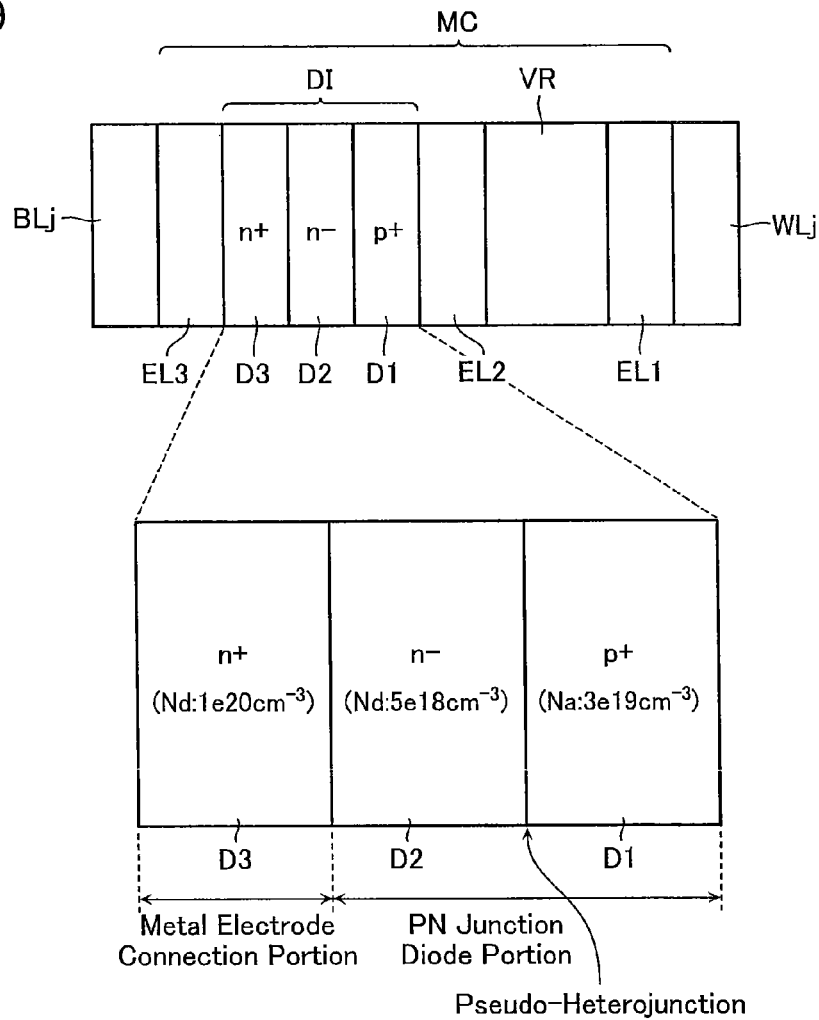
FIG. 9 is a cross-sectional view showing a structure of a memory cell in the first embodiment.

Next, a configuration of the diode DI in the memory cell MC is described in detail with reference to FIG. 9. FIG. 9 is a cross-sectional view showing a structure of the memory cell MC and the diode DI in accordance with the embodiment. As previously mentioned, the memory cell MC is configured by the diode DI, variable resistor VR, and the metal electrodes EL1-EL3 connected in series.

As shown in FIG. 9, the diode DI in accordance with the embodiment is a PN junction diode comprising the p+ type layer D1, the n− type layer D2, and the n+ type layer D3. Now, the p+ type layer D1 and n− type layer D2 of the diode DI represent a PN junction diode portion, and the n+ type layer D3 is a portion provided for connection to the metal electrode EL3. In the present embodiment, the p+ type layer D1, the n− type layer D2, and the n+ type layer D3 are configured by monocrystalline silicon (Si).

Used as an impurity (acceptor) introduced to the p+ type layer D1 is, for example, boron (B). The p+ type layer D1 has an impurity concentration of, for example, $3\times10^{19}$ cm$^{-3}$. Used as an impurity (donor) introduced to the n+ type layer D3 is, for example, phosphorus (P) or arsenic (As). Diffused in the n− type layer D2 is, for example, phosphorus (P) or arsenic (As). The n-type layer D2 has an impurity concentration of, for example, $5\times10^{18}$ cm$^{-3}$, and the n+ type layer D3 has an impurity concentration of, for example, $1\times10^{20}$ cm$^{-3}$.

When monocrystalline silicon is used for the p+ type layer D1, the impurity concentration of the p+ type layer D1 is preferably set to not less than $3\times10^{19}$ cm$^{-3}$. If the p+ type layer D1 has an impurity concentration less than $3\times10^{19}$ cm$^{-3}$, there is a risk that band gap reduction effect does not occur. It is therefore preferable to set to the above-described impurity concentrations when monocrystalline silicon (Si) is used for the p+ type layer D1.

In the diode DI of the embodiment, the impurity concentration of the p+ type layer D1 is higher than the impurity concentration of the n− type layer D2. Forming each of the layers with such impurity concentrations results in a width of the band gap differing between the p+ type layer D1 and the n− type layer D2. A PN junction is formed between the p+ type layer D1 and the n− type layer D2. The PN junction, i.e., the border portion between the p+ type layer D1 and the n− type layer D2 is formed by two layers that are formed by the same material, but have different band gap widths from each other. Accordingly, the PN junction is formed as pseudo-heterojunction.

Figure 10:
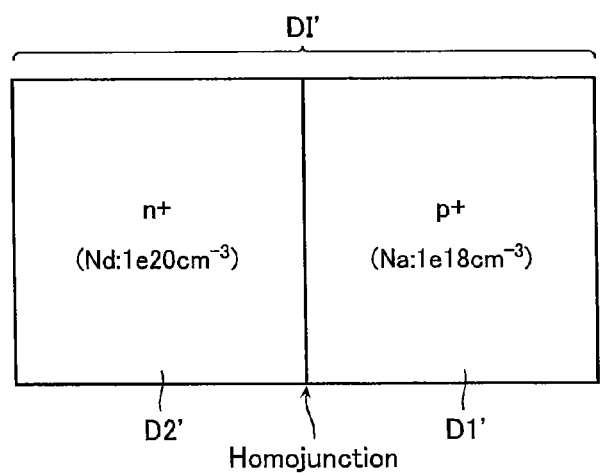
FIG. 10 is a cross-sectional view showing a structure of a diode in a comparative example.

Operation of this diode DI of the present embodiment is described in comparison to that of a diode DI' of a comparative example. First, a configuration of the diode DI' of the comparative example is described with reference to FIG. 10. FIG. 10 is a cross-sectional view showing a structure of the diode DI' in accordance with the comparative example. As shown in FIG. 10, the diode DI' in accordance with the comparative example is a PN junction diode comprising a p+ type layer D1' and an n+ type layer D2'. The diode DI' of the comparative example differs from the diode DI of the embodiment in having the n+ type layer D2' connected directly to the metal electrode. Further, the diode DI' of the comparative example has impurity concentrations of impurities introduced to each of the layers that differ from those of the diode DI of the embodiment.

In the comparative example, the p+ type layer D1' and the n+ type layer D2' are configured by monocrystalline silicon (Si). Used as an impurity (acceptor) introduced to the p+ type layer D1' is, for example, boron (B). The p+ type layer D1' has an impurity concentration of, for example, $1\times10^{18}$ cm$^{-3}$. This is lower than the impurity concentration of the p+ type layer D1 of the embodiment shown in FIG. 9. Moreover, used as an impurity (donor) introduced to the n+ type layer D2' of the comparative example is, for example, phosphorus (P) or arsenic (As). The n+ type layer D2' has an impurity concentration of, for example, $1\times10^{20}$ cm$^{-3}$. This is higher than the impurity concentration of the n− type layer D2 of the embodiment shown in FIG. 9.

In the diode DI' of the comparative example shown in FIG. 10, the impurity concentration of the n+ type layer D2' is higher than the impurity concentration of the p+ type layer D1'. Forming each of the layers with such impurity concentrations results in a width of the band gap being substantially equal for the p+ type layer D1' and the n+ type layer D2'. A PN junction is formed between the p+ type layer D1' and the n+ type layer D2'. The PN junction, i.e., the border portion between the p+ type layer D1' and the n+ type layer D2' is formed by two layers that are formed by the same material and, moreover, have band gap widths that are equal. Accordingly, the PN junction is formed as homojunction.

Next, operation of the diode DI in accordance with the embodiment and the diode DI' in accordance with the comparative example are described with reference to FIGS. 11 and 12.

Figure 11:
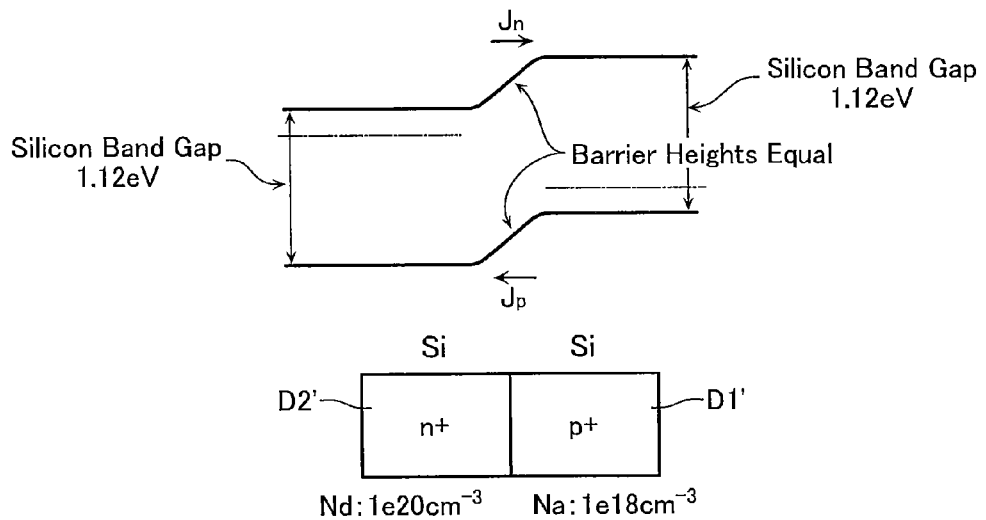
FIG. 11 is a view showing a state of energy bands in the diode in the comparative example.

FIG. 11 is a view showing a state of energy bands in the diode DI' in accordance with the comparative example. FIG. 11 shows the state of energy bands in the PN junction portion, that is, the border portion between the p+ type layer D1' and the n+ type layer D2' of the diode DI'. The p+ type layer D1' and the n+ type layer D2' are formed by silicon (Si). Each of the p+ type layer D1' and the n+ type layer D2' has a band gap of approximately 1.12 eV. As a result, a height of an energy barrier against an electron current Jn is equal to that against a hole current Jp.

Figure 12:
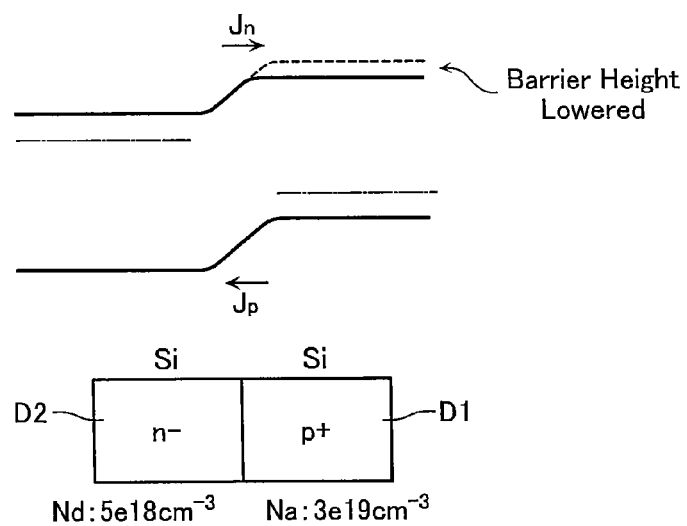
FIG. 12 is a view showing a state of energy bands in a diode in the first embodiment.

FIG. 12 is a view showing a state of energy bands in the diode DI in accordance with the embodiment. FIG. 12 shows the state of energy bands in the PN junction portion, that is, the border portion between the p+ type layer D1 and the n− type layer D2 of the diode DI. The p+ type layer D1 and the n− type layer D2 are formed by silicon (Si). Now as previously mentioned, on both sides of the PN junction portion of the diode DI in the embodiment, the impurity concentration of the p+ type layer D1 is higher than the impurity concentration of the n− type layer D2. When silicon (Si) having such impurity concentrations forms a junction, a high-concentration band gap reduction effect in the p+ type layer D1 causes the junction to be a pseudo-heterojunction. The band gap width in the p+ type layer D1 is reduced, whereby the energy barrier with respect to the electron current Jn flowing from the n− type layer D2 toward the p+ type layer D1 is lowered. Consequently, the recombination of electrons and holes is reduced, whereby the forward bias direction current flowing in the diode DI (current flowing from the n− type layer D2 to the p+ type layer D1) increases.

When a diode is configured with the impurity concentrations illustrated in the embodiment, the band gap width is reduced by about 100 meV in comparison with the diode DI' of the comparative example. Using the diode DI of the embodiment allows the value of the forward bias direction current to be increased by a factor of 10 or more compared to the diode DI' of the comparative example.

[Others]

From the point of view of increasing forward bias direction current in a PN junction diode, it is desirable for the PN junction diode to be completely crystallized. Hence, description of the embodiment proceeded on the assumption that the p+ type layer D1 and the n− type layer D2 in the embodiment are of monocrystalline silicon. However, the p+ type layer D1 and the n− type layer D2 are not limited to being of monocrystalline silicon.

For example, at least a portion of the p+ type layer D1 and the n− type layer D2 may be of amorphous silicon or polycrystalline silicon. It is possible also in the case of using amorphous silicon or polycrystalline silicon in the p+ type layer D1 and the n− type layer D2 for the forward bias direction current flowing in the diode DI to be increased similarly to in the embodiment by configuring the junction interface between the p+ type layer D1 and the n− type layer D2 as a pseudo-heterojunction. There is an increase in the forward bias direction current component due to the above-mentioned effects of the pseudo-heterojunction, even if crystallization of the amorphous silicon or polycrystalline silicon used in the p+ type layer D1 and the n− type layer D2 is not complete.

As the above makes clear, there is no need for the diode DI to be completely crystallized in order for the junction interface between the p+ type layer D1 and the n− type layer D2 to be a pseudo-heterojunction. The heat application process for crystallizing the diode DI can therefore be reduced. As a result, effects of the heating process on the variable resistor VR can be alleviated, and effects on performance of the variable resistor VR can be reduced.

When amorphous silicon is used for the p+ type layer D1, the impurity concentration of the p+ type layer D1 is preferably set to a range of not less than $3 \times 10^{19}$ cm$^{-3}$ and not more than $5 \times 10^{19}$ cm$^{-3}$. If the p+ type layer D1 has an impurity concentration less than $3 \times 10^{19}$ cm$^{-3}$, there is a risk that band gap reduction effect does not occur, similarly to in the case of monocrystalline silicon, and if the p+ type layer D1 has an impurity concentration greater than $5 \times 10^{19}$ cm$^{-3}$, there is a risk that crystalline defects are generated in the p+ type layer D1. Moreover, when polycrystalline silicon is used for the p+ type layer D1, the impurity concentration of the p+ type layer D1 is preferably set to a range of not less than $3 \times 10^{19}$ cm$^{-3}$ and not more than $1 \times 10^{21}$ cm$^{-3}$. If the p+ type layer D1 has an impurity concentration less than $3 \times 10^{19}$ cm$^{-3}$, there is a risk that band gap reduction effect does not occur, similarly to in the case of monocrystalline silicon, and if the p+ type layer D1 has an impurity concentration greater than $1 \times 10^{21}$ cm$^{-3}$, there is a risk that the impurity is precipitated in the p+ type layer D1. It is therefore preferable to set to the above-described impurity concentrations when amorphous silicon or polycrystalline silicon is used for the p+ type layer D1.

Figure 13:
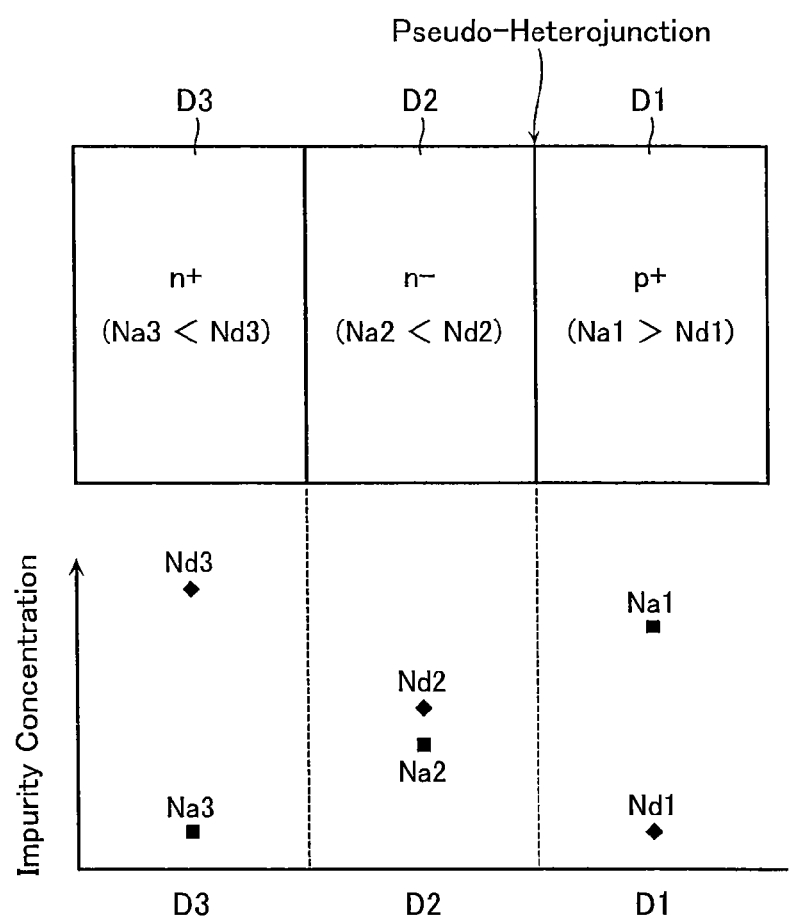
FIG. 13 is a cross-sectional view showing a structure of a diode in another example.

As shown in FIG. 13, the p+ type layer D1, the n-type layer D2, and the n+ type layer D3, provided that they maintain their respective electrical properties, that is, of being p+ type, n− type, and n+ type, may each contain both a p type impurity and an n type impurity. For example, the n− type layer D2 may contain a p type impurity. However, in order to maintain the n− type layer D2 as n− type in this case, a concentration (Na2) of the p type impurity in the n− type layer D2 is lower than a concentration (Nd2) of the n type impurity in the n− type layer D2. This configuration allows the n-type layer D2 to include both the n type impurity and the p type impurity, and allows an electrical n− type to be formed by the difference in included amount of these n type and p type impurities. It is preferable for impurities of both conductivity types to be included since this facilitates formation of the electrically low concentration n− type. Note that, as mentioned above, it is the fact that the n− type layer D2 is n-type which gives rise to the resulting fact that a pseudo-heterojunction can be formed at the interface between the p+ type layer D1 and the n− type layer D2.

Similarly, the p+ type layer D1 may contain an n type impurity. In this case, a concentration (Nd1) of the n type impurity in the p+ type layer D1 is lower than a concentration (Na1) of the p type impurity in the p+ type layer D1. Furthermore, it is preferable for the concentration Nd1 of the n type impurity in the p+ type layer D1 to be low in order to maintain the electrically high concentration p+ type and thereby form a pseudo-heterojunction at the interface between the p+ type layer D1 and the n− type layer D2. Specifically, the concentration Nd1 of the n type impurity in the p+ type layer D1 is preferably lower than the concentration Na2 of the p type impurity in the n− type layer D2.

Likewise, the n+ type layer D3 may contain a p type impurity, in which case, a concentration (Na3) of the p type impurity in the n+ type layer D3 is lower than a concentration (Nd3) of the n type impurity in the n+ type layer D3. It is preferable for the concentration Na3 of the p type impurity in the n+ type layer D3 to be low in order to maintain the electrically high concentration n+ type. Specifically, the concentration Na3 of the p type impurity in the n+ type layer D3 is preferably lower than the concentration Na2 of the p type impurity in the n− type layer D2.

In the case that the p+ type layer D1, the n− type layer D2, and the n+ type layer D3 each contain a p type impurity and an n type impurity, the concentration distribution of the p type impurity in DI preferably has a peak in the p+ type layer D1 (Na1) and becomes lower in the order of the n− type layer D2 (Na2) and the n+ type layer D3 (Na3). Similarly, the concentration distribution of the n type impurity in DI preferably has a peak in the n+ type layer D3 (Nd3) and becomes lower in the order of the n− type layer D2 (Nd2) and the p+ type layer D1 (Nd1). Note that, as shown in FIGS. 9 and 13, a peak value (Nd3) of the n type impurity concentration is preferably higher than a peak value (Na1) of the p type impurity concentration.

Note that measurement of impurity concentration is performed using, for example, a laser atom probe. A mean value is assumed to be used for the impurity concentrations in each of the layers.

This concludes description of embodiments of the present invention, but it should be noted that the present invention is not limited to the above-described embodiments, and that various alterations, additions, combinations, and so on, are possible within a range not departing from the scope and spirit of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a plurality of first lines disposed in parallel;
   a plurality of second lines disposed to intersect the first lines; and
   a memory cell array including memory cells, each of the memory cells being disposed at each of intersections of the first lines and the second lines, and each of the memory cells being configured by a rectifier element and a variable resistor connected in series,
   the rectifier element comprising:
   a first semiconductor region including an impurity of a first conductivity type at a first impurity concentration; and
   a second semiconductor region including an impurity of a second conductivity type at a second impurity concentration lower than the first impurity concentration and including an impurity of the first conductivity type at a third impurity concentration lower than the second impurity concentration,
   the first semiconductor region and the second semiconductor region being formed by silicon.

2. The semiconductor memory device according to claim 1, wherein the first impurity concentration is not less than $3 \times 10^{19}$ cm$^{-3}$.

3. The semiconductor memory device according to claim 1, wherein the first semiconductor region includes an impurity of the second conductivity type at a fourth impurity concentration lower than the third impurity concentration.

4. The semiconductor memory device according to claim 1, wherein at least a portion of the first semiconductor region is formed by amorphous silicon.

5. The semiconductor memory device according to claim 4, wherein the first impurity concentration is not less than $3 \times 10^{19}$ cm$^{-3}$ and not more than $5 \times 10^{19}$ cm$^{-3}$.

6. The semiconductor memory device according to claim 1, wherein at least a portion of the first semiconductor region is formed by polycrystalline silicon.

7. The semiconductor memory device according to claim 6, wherein the first impurity concentration is not less than $3 \times 10^{19}$ cm$^{-3}$ and not more than $1 \times 10^{21}$ cm$^{-3}$.

8. The semiconductor memory device according to claim 1, wherein the rectifier element further comprises a third semiconductor region provided to be in contact with the second semiconductor region and including an impurity of the second conductivity type at a fifth impurity concentration higher than the second impurity concentration.

9. The semiconductor memory device according to claim 8, wherein the fifth impurity concentration is higher than the first impurity concentration.

10. The semiconductor memory device according to claim 8, wherein the third semiconductor region includes an impurity of the first conductivity type at a sixth impurity concentration lower than the third impurity concentration.

11. The semiconductor memory device according to claim 1, wherein the first semiconductor region and the second semiconductor region are formed by monocrystalline silicon.

* * * * *